United States Patent
Gu et al.

(10) Patent No.: US 9,735,210 B2
(45) Date of Patent: Aug. 15, 2017

(54) OLED DISPLAY APPARATUS WITH IN CELL TOUCH STRUCTURE

(71) Applicants: Shanghai Tianma Micro-Electronics Co., Ltd., Shanghai (CN); Tianma Micro-Electronics Co., Ltd., Shenzhen (CN)

(72) Inventors: Hanyu Gu, Shanghai (CN); Dong Qian, Shanghai (CN); Tong Zhang, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 164 days.

(21) Appl. No.: 14/275,740

(22) Filed: May 12, 2014

(65) Prior Publication Data

US 2015/0162387 A1  Jun. 11, 2015

(30) Foreign Application Priority Data

Dec. 11, 2013 (CN) .......................... 2013 1 0676075

(51) Int. Cl.
*H01L 27/32* (2006.01)
*G06F 3/041* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
None
See application file for complete search history.

(56) References Cited

U.S. PATENT DOCUMENTS 8,530,766 B2 * 9/2013 Choi ...................... G06F 3/044
200/5 A
2007/0182719 A1 8/2007 Lee et al.
(Continued)

FOREIGN PATENT DOCUMENTS

CN 101008727 A 8/2007
CN 101135791 A 3/2008
(Continued)

OTHER PUBLICATIONS

Office Action in corresponding Chinese Application No. 201310676075.7, dated Aug. 27, 2015.
(Continued)

*Primary Examiner* — Jennifer Mehmood
*Assistant Examiner* — Parul Gupta
(74) *Attorney, Agent, or Firm* — Alston & Bird LLP

(57) ABSTRACT

An OLED display apparatus with an in cell touch structure includes a cover plate, an array substrate facing the cover plate, an organic light-emitting layer arranged therebetween, multiple driving lines and multiple sensing lines arranged at an inner side of the cover plate facing the array substrate, multiple signal pins arranged at an inner side of the array substrate, where each of the signal pins corresponds to one of the driving lines or one of the sensing lines, and multiple conductive structures. The conductive structures are arranged between the driving lines and the signal pins or between the sensing lines and the signal pins. Each conductive structure includes an end electrically connecting a driving line or a sensing line to a corresponding signal pin, and an opposite end electrically connected to a corresponding touch signal transmission line.

15 Claims, 10 Drawing Sheets

(51) Int. Cl.
*G06F 3/044* (2006.01)
*H01L 51/52* (2006.01)

(52) U.S. Cl.
CPC ........... *G06F 2203/04103* (2013.01); *G06F 2203/04111* (2013.01); *G06F 2203/04112* (2013.01); *H01L 51/525* (2013.01)

(56) References Cited

U.S. PATENT DOCUMENTS

| | | | |
|---|---|---|---|
| 2008/0136980 A1 | 6/2008 | Rho et al. | |
| 2008/0151133 A1 | 6/2008 | Kim et al. | |
| 2008/0170028 A1* | 7/2008 | Yoshida | G09G 3/20 345/100 |
| 2010/0309150 A1 | 12/2010 | Lee et al. | |
| 2011/0316802 A1 | 12/2011 | Choi | |
| 2012/0105341 A1* | 5/2012 | Park | G06F 3/0412 345/173 |
| 2014/0048854 A1 | 2/2014 | Wang et al. | |
| 2014/0145187 A1 | 5/2014 | Umezaki | |

FOREIGN PATENT DOCUMENTS

| | | |
|---|---|---|
| CN | 101174047 A | 5/2008 |
| CN | 101196652 A | 6/2008 |
| CN | 101339314 A | 1/2009 |
| CN | 101894856 A | 11/2010 |
| CN | 102043270 A | 5/2011 |
| CN | 102830879 A | 12/2012 |
| KR | 20080085583 A | 9/2008 |
| KR | 20100131797 A | 12/2010 |

OTHER PUBLICATIONS

German Application No. 102014109404.2, First Office Action issued Jul. 19, 2016.

\* cited by examiner

OLED DISPLAY APPARATUS WITH IN CELL TOUCH STRUCTURE

CROSS-REFERENCES TO RELATED APPLICATIONS

This application claims the benefit of priority to Chinese Patent Application No. 201310676075.7, filed with the Chinese Patent Office on Dec. 11, 2013 and entitled "OLED DISPLAY APPARATUS WITH IN CELL TOUCH STRUCTURE", the content of which is incorporated herein by reference in its entirety.

FIELD OF THE INVENTION

The disclosure relates to the field of OLED display technology, and particularly to an OLED display apparatus with an in cell touch structure.

BACKGROUND OF THE INVENTION

Organic Light Emitting Diode (OLED) display technology adopts a coating of an organic material to provide a characteristic of self-illumination. An OLED display screen has a large visible angle and saves power, which thus has been widely used. With the development of touch technology, a touch structure is provided inside most portable display apparatuses, which may be operated by a user directly via a touch pen or a finger of the user.

However, in the existing technology, the OLED display apparatus is generally combined with the touch panel by a process of attaching the touch panel on an outside of the OLED display apparatus. The apparatus with an on cell touch panel has many problems such as a large thickness and an easy damage of the touch structure.

BRIEF SUMMARY OF THE INVENTION

In view of this, an OLED display apparatus with an in cell touch structure is provided.

The OLED display apparatus with the in cell touch structure includes: a cover plate, an array substrate facing the cover plate, an organic light-emitting layer arranged between the cover plate and the array substrate, a plurality of driving lines and a plurality of sensing lines arranged at an inner side of the cover plate facing the array substrate, a plurality of signal pins arranged at an inner side of the array substrate facing the cover plate, wherein each of the signal pins corresponds to one of the driving lines or one of the sensing lines; and a plurality of conductive structures. Each of the conductive structures is arranged between a driving line and a corresponding signal pin or between a sensing line and a corresponding signal pin. Each conductive structure includes an end electrically connecting the driving line or the scanning line to the corresponding signal pin, and an opposite end electrically connected to a corresponding touch signal transmission line.

In the OLED display apparatus with the in cell touch structure according to the disclosure, the driving lines, the sensing lines and the touch signal transmission structure of the touch structure are all arranged between the cover plate and the array substrate, thus implementing an integration, lightening and thinning of the OLED display apparatus incorporating with the touch structure. Comparing with the conventional OLED display apparatus, no step is added in the process for manufacturing the OLED display apparatus according to the disclosure, thus implementing process compatibility.

DETAILED DESCRIPTION OF THE INVENTION

In order to understand the technical solution of the disclosure, specific embodiments are taken and illustrated as follows in combination with the attached drawings. However, the drawings and specific embodiments below are not intended to limit the disclosure, and some alterations and modifications may be made by those skilled in the art without departing from the spirit and scope of the disclosure. Therefore the scope of protection of the disclosure should be defined by the claims.

Figure 1:
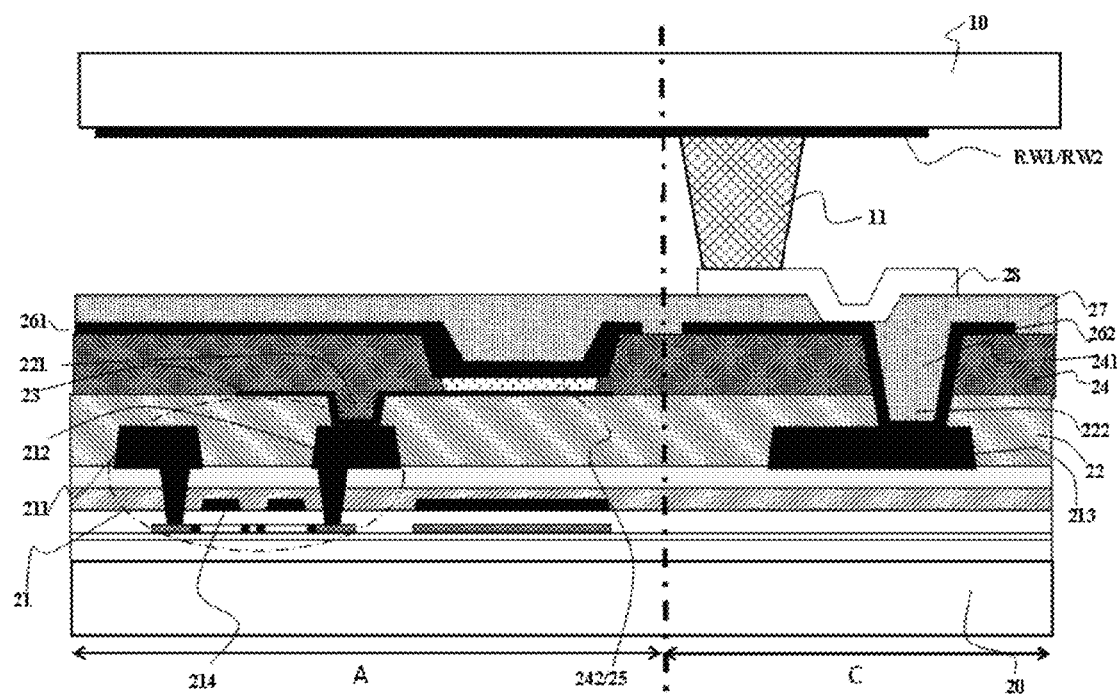
FIG. 1 is a cross-sectional view of an OLED display apparatus with an in cell touch structure according to a first embodiment of the disclosure.
Figure 2:
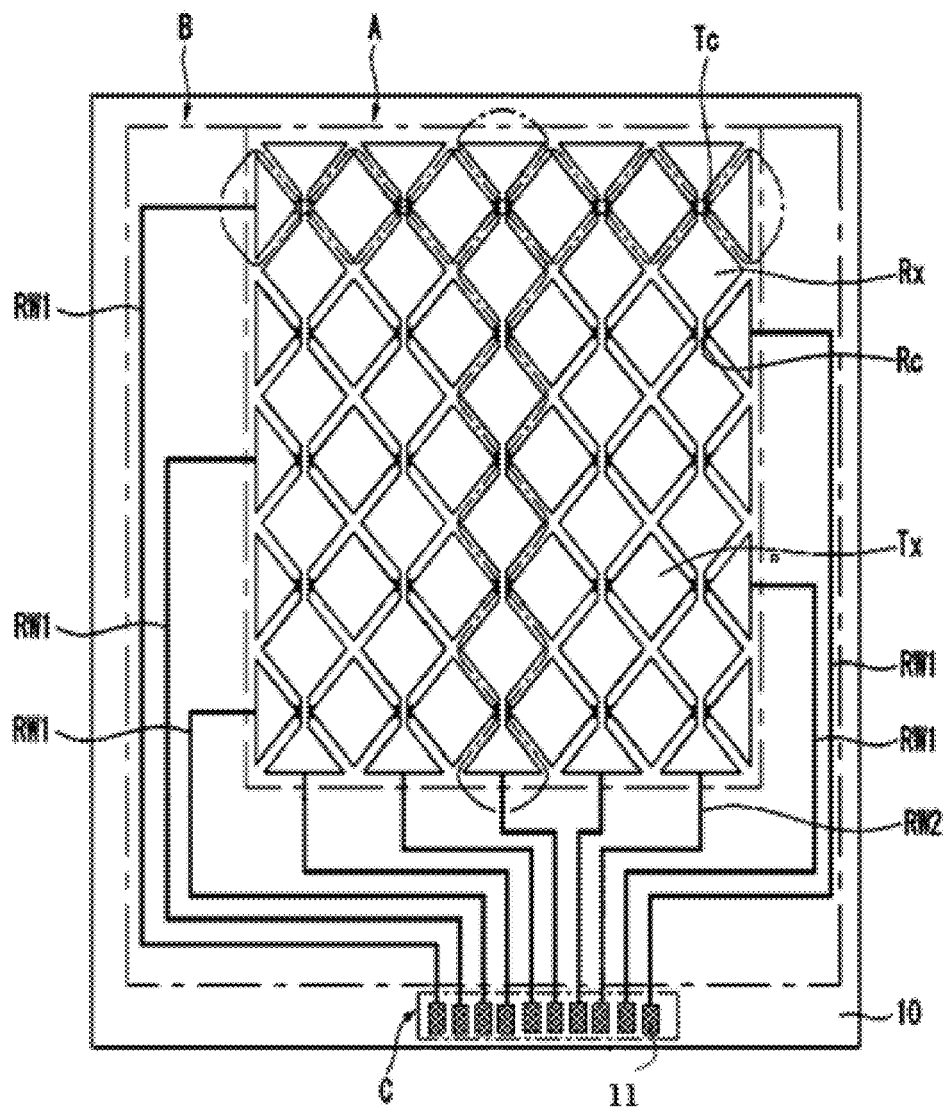
FIG. 2 is a top view of a cover plate according to the first embodiment.
Figure 3:
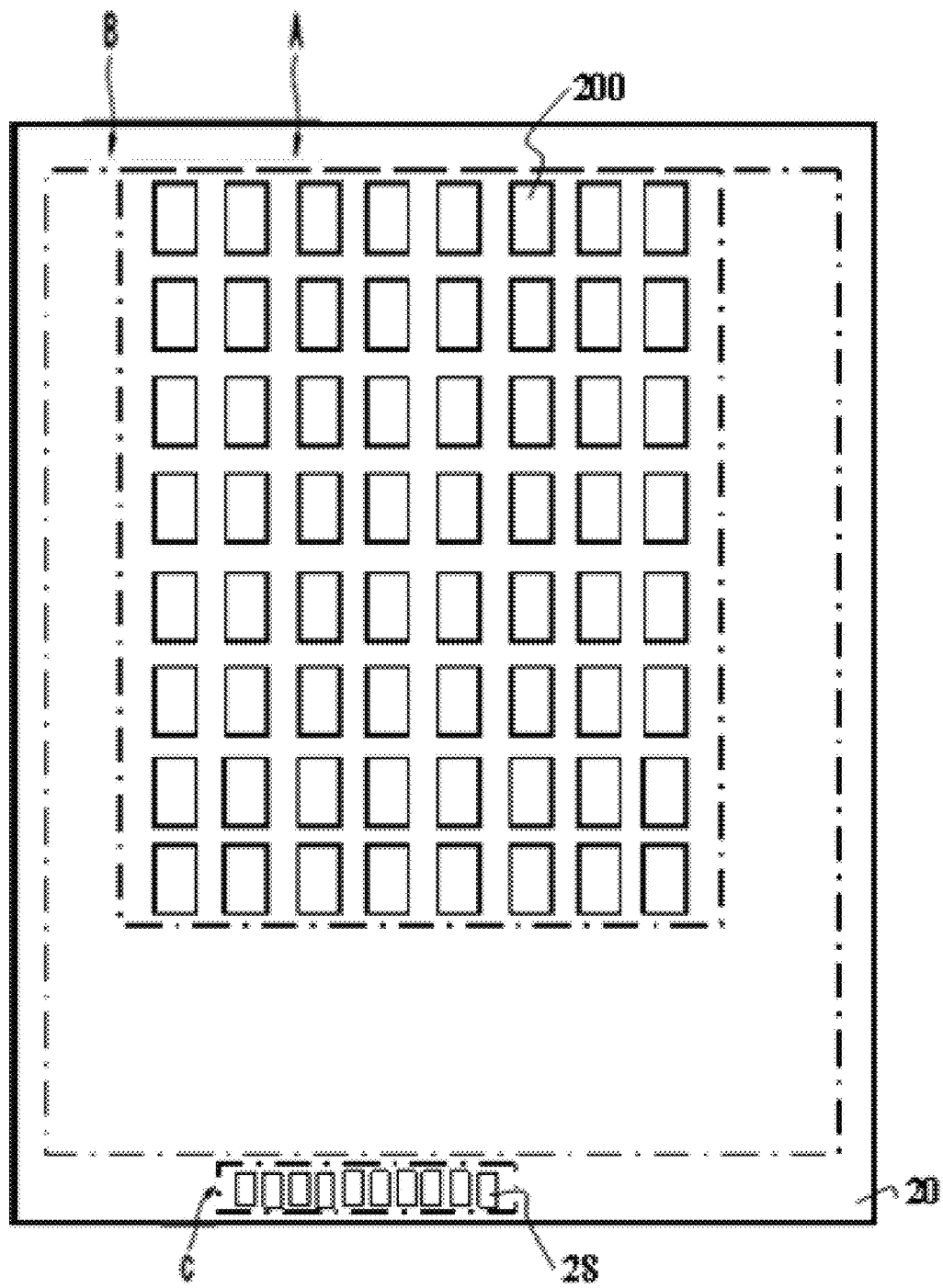
FIG. 3 is a cross-sectional view of an array substrate according to the first embodiment.

Referring to FIGS. 1 to 3, FIG. 1 is cross-sectional view of an OLED display apparatus with an in cell touch structure according to a first embodiment of the disclosure, FIG. 2 is a top view of a cover plate according to the first embodiment, and FIG. 3 is a cross-sectional view of an array substrate according to the first embodiment. As shown in FIGS. 1 through 3, the OLED display apparatus with the in cell touch structure includes a cover plate 10 and an array substrate 20 facing the cover plate 10. The OLED display apparatus with the in cell touch structure includes a display area A, a layout area B, and a signal pin area C.

Multiple driving lines RW1 and multiple sensing lines RW2 are arranged at an inner side of the cover plate 10 facing the array substrate 20. The driving lines RW1 cross the sensing lines RW2 and are insulated from the sensing lines RW2. In the display area A, each of the driving lines RW1 includes multiple driving electrodes Tx arranged in a horizontal direction, and multiple first connecting lines Tc arranged between the adjacent driving electrodes Tx to connect the adjacent driving electrodes Tx. In the display area A, each of the sensing lines RW2 includes multiple sensing electrodes Rx arranged in a vertical direction, and multiple second connecting lines Rc arranged between the adjacent sensing electrodes Rx to connect the adjacent sensing electrodes Rx. In the first embodiment, multiple driving lines RW and multiple sensing lines RW2 constitute a mutual capacitance touch sensing structure. However, in other implementations, multiple driving lines and multiple sensing lines may also constitute other touch sensing structure, such as a self-capacitance touch sensing structure.

At the inner side of the cover plate 10, in the layout area B, multiple driving lines RW1 and multiple sensing lines RW2 are elongated. In the signal pin area C, multiple driving lines RW1 and multiple sensing lines RW2 are electrically connected to multiple conductive structures 11 respectively. In the first embodiment, multiple conductive structures 11 are formed at the inner side of the cover plate 10, which are conductive supports.

At the inner side of the array substrate 20, in the display area A, multiple pixel units 200 are arranged. Each pixel unit 200 includes one thin film transistor 21 and one organic light-emitting layer 25. In the signal pin area C, multiple signal pins 28 are arranged at the inner side of the cover plate 10, each of which corresponds to one driving line RW1 or one sensing line RW2. Each signal pin 28 is electrically connected to the corresponding driving line RW1 or the corresponding sensing line RW2 through the conductive structure 11. The other end of the signal pin 28 is connected to a touch signal transmission line 213. The touch signal transmission line 213 may be electrically connected to a touch driving chip. Thus, a touch signal is transmitted to the driving line RW1 and the sensing line RW2 through the touch signal transmission line 213, the signal pin 28, and the conductive structure 11.

Based on the above arrangement, the driving lines, the sensing lines and the touch signal transmission structure (including the touch signal transmission lines, the signal pins, and the conductive structures) may be arranged inside the OLED display apparatus, which improves an integration level of the apparatus. In addition, the risk of the damage may be reduced by arranging the touch structure inside the OLED display apparatus.

In an embodiment, the array substrate 20 includes thin film transistors 21 arranged in the display region A. Each of the thin film transistors 21 includes the source 211, the drain 212, and the gate 214. The source 211 and the drain 212 are arranged in the same conductive layer. An insulating layer is arranged among the gate 214, the source 211 and the drain 212. In the first embodiment, the thin film transistor 21 has a bottom gate structure. In the bottom gate structure, the gate 214 is disposed at a lower layer of the source 211 and the drain 212. Conversely, in a top gate structure, the gate will be disposed at an upper layer of the source and the drain. In addition, touch signal transmission lines 213 is arranged in the signal pin area C, and the touch signal transmission lines 213 are disposed in the same layer of the sources 211 and the drains 212, and are produced in the same process step for generating the sources 211 and the drains 212. The touch signal transmission lines 213 are made of a metal material.

An organic planarizing layer 22 is arranged on the thin film transistors 21 and the touch signal transmission lines 213. A via hole 221 is arranged in the organic planarizing layer 22 disposed on the drain 212 to expose a portion of the drain 212. A via hole 222 is arranged in the organic planarizing layer 22 disposed on the touch signal transmission line 213 to expose a portion of the touch signal transmission line 213.

An anode 23 is arranged at an upper layer of the organic planarizing layer 22. In an embodiment, the anode 23 is arranged in the pixel unit 200 of the display area A, and is electrically connected to the drain 212 through the via hole 221.

A pixel defining layer 24 is arranged at an upper layer of the anode 23, which is an insulating layer. A via hole 242 is arranged in the pixel defining layer 24 disposed on the anode 23 to expose the anode 23. A via hole 241 is arranged in the pixel defining layer 24 disposed on the via hole 222, and thus the touch signal transmission line 213 is exposed through the via hole 222 and the via hole 241.

The organic light-emitting layer 25 is arranged in the via hole 242, the organic light-emitting layer 25 displays different pictures by self-illumination. In the display area A, a cathode 261 is formed at an upper layer of the organic light-emitting layer 25. In addition, in the signal pin area C, a cathode conductive layer 262 is formed at the same layer with the cathode 261. The cathode conductive layer 262 is electrically connected to the touch signal transmission line 213 through the via holes 222, 241. A protective layer 27 is formed on the cathode 261 and the cathode conductive layer 262. The protective layer 27 is an insulating layer, and adapted to insulate and protect the organic light-emitting layer 25 and other apparatus. A via hole is formed in the protective layer 27 disposed on the cathode conductive layer 262 of the signal pin area C, to expose a portion of the cathode conductive layer 262.

A signal pin 28 is formed on the protective layer 27 of the signal pin area C, which is electrically connected to the touch signal transmission line 213. In an embodiment, the signal pin 28 is electrically connected to the touch signal transmission line 213 through the cathode conductive layer 262, and conducts a touch signal transmitted from the touch signal transmission line 213 to the driving line RW1 or the sensing line RW2 through the conductive structure 11. In this way, the touch signal may be transmitted from the array substrate 20 to the cover plate 10, in the OLED display apparatus.

In the other implementation way, the touch signal transmission line may also be arranged in the same layer with the signal pin. Generally, in the array substrate 20, all layers from the thin film transistor 21 to the pixel defining layer 24 are formed by a photolithography process. Specifically, a film is formed firstly by sputtering or chemical vapor deposition, and then each layer is formed by dry etching process or wet etching process. The formed layer has higher compactness and may be disposed accurately. Then, the organic light-emitting layer 25 is formed by an evaporation process. In order to ensure stability of the organic light-emitting layer 25, the photolithography process cannot be used, and thus devices (including the protective layer 27 and the signal pin 28) disposed on the organic light-emitting layer 25 also has to be formed by the evaporation process. A film layer or a device formed by an evaporation process has a poor compactness and shape, comparing with those formed by an etching process. Therefore, in the first embodiment, the touch signal transmission line 213 disposed in the same layer with the source 211 and the drain 212 is used as a layout connected to the driving chip, and the signal pin 28 is just a transmission layer for transmitting a signal from the touch signal transmission line 213. The above structure has better stability, and may ensure the reliability of a device.

Figure 4:
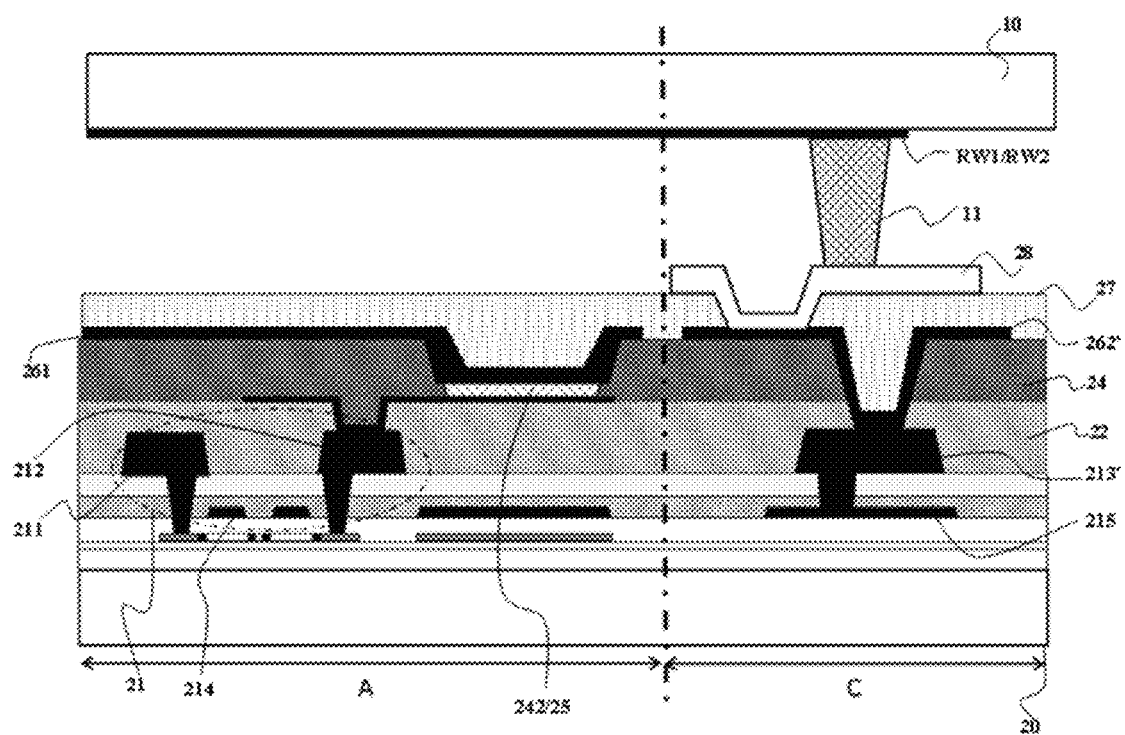
FIG. 4 is a cross-sectional view of another implementation according to the first embodiment.
Figure 5:
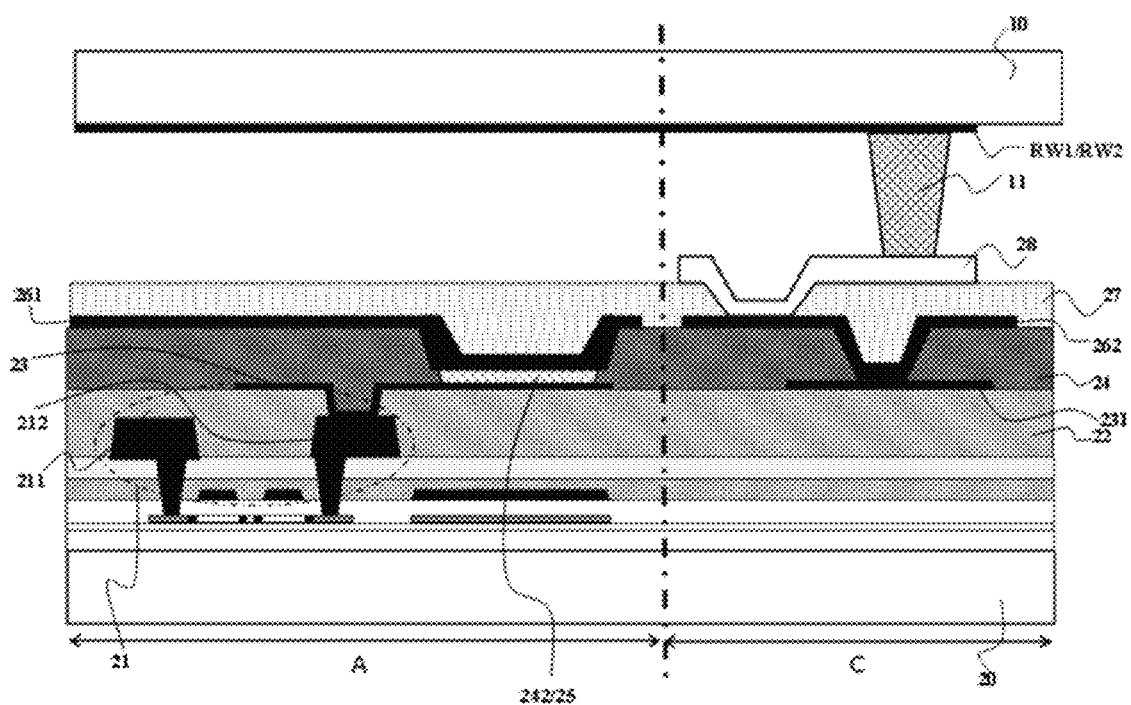
FIG. 5 is a cross-sectional view of yet another implementation according to the first embodiment.

In the other implementation way, the touch signal transmission line may also be a structure that is disposed in the same layer with other conductive layers formed by the photolithography process. The location of the touch signal transmission line may be arranged flexibly according to different design requirements. FIG. 4 is a cross-sectional view of another implementation according to the first embodiment. Referring to FIG. 4, a touch signal transmission line 215 is disposed in the same layer as the gate 214 of the thin film transistor 21, and is formed in the same process step for manufacturing the gate 214 of the thin film transistor 21, specifically in the same photolithography process. Multiple layers are disposed between the touch signal transmission line 215 and the signal pin 28. In order to ensure the reliability of an electrical connection between the touch signal transmission line 215 and the signal pin 28, the touch signal transmission line 215 is electrically connected to the signal pin 28 through a source-drain conductive layer 213' disposed in the same layer as the source 211 and the drain 212, and a cathode conductive layer 262' disposed in the same layer as the cathode 261. FIG. 5 is a cross-sectional view of yet another implementation according to the first embodiment. Referring to FIG. 5, the touch signal transmission line 231 is disposed in the same layer as the anode 23, and both the touch signal transmission line 231 and the anode 23 are formed in the same photolithography process. The touch signal transmission line 231 is electrically connected to the signal pin 28 through the cathode conductive layer 262 disposed in the same layer as the cathode 261.

Preferably, in the OLED display apparatus with the in cell touch structure according to the first embodiment, a thickness of the cover plate 10 and a thickness of a substrate of the array substrate 20 are in the range of 0.15 mm to 0.3 mm. In the existing technology, the thicknesses of glass substrates forming the cover plate and the array substrate are generally 0.5 mm, to ensure that the glass substrate is not easily cracked in a conveyance of a product and in a cutting process. To lighten and thin the display apparatus, a thinning process is performed after the cover plate and the array substrate are bonded together. The thinning process includes: etching outside sides of the glass substrates of the cover plate and the array substrate with an etchant to remove a certain thickness of the glass substrates, and thus lightening and thinning the display apparatus. Generally, a thickness of the thinned glass substrate are in the range of 0.3 mm to 0.15 mm. However, in the existing technology, because the touch structure is arranged outside the cover plate, the touch structure will be damaged when the thinning process is executed. Therefore, in the existing technology, the thinning process cannot be performed on the OLED display apparatus with the touch structure arranged outside the cover plate. In the OLED display apparatus according to the first embodiment, the driving line, the sensing line, and the touch signal transmission structure of the touch structure are all formed between the cover plate and the array substrate of the OLED display apparatus. Therefore, the thinning process may be performed after the cover plate and the array substrate are bonded together, to lighten and thin the touch OLED display apparatus.

In addition, the cover plate 10 and the array substrate 20 generally are bonded together by a packaging material to form a sealing space for insulation outside air and moisture. Preferably, the signal pin area C is arranged inside the sealing space to ensure the stability and reliability of an electrical connection.

Figure 6:
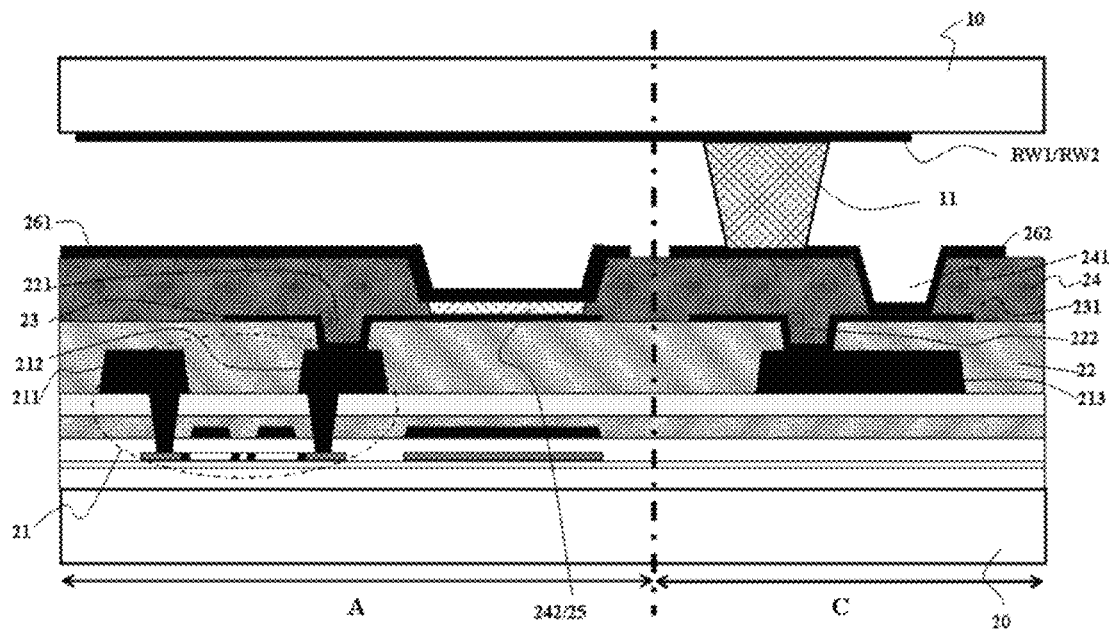
FIG. 6 is a cross-sectional view of an OLED display apparatus with an in cell touch structure according to a second embodiment of the disclosure.

FIG. 6 is a schematic diagram of an OLED display apparatus with an in cell touch structure according to a second embodiment of the disclosure. Referring to FIG. 6, the OLED display apparatus with the in cell touch structure includes a cover plate 10, and an array substrate 20 facing the cover plate 10. The OLED display apparatus with the in cell touch structure is divided into a display area A, a layout area B (not shown), and a signal pin area C.

Multiple driving lines RW1 and multiple sensing lines RW2 are arranged at an inner side of the cover plate 10 facing the array substrate. The driving lines RW1 cross the sensing lines RW2 and are insulated from the sensing lines RW2. In the signal pin area C, multiple driving lines RW1 and multiple sensing lines RW2 are electrically connected to multiple conductive structures 11, respectively. The conductive structures 11 are formed on one side of the cover plate 10, i.e., the conductive structures 11 are formed on the inner side of the cover plate 10. The conductive structures 11 serve as a mechanical support to the cover plate.

At the inner side of the array substrate 20, in the display area A, multiple pixel units are arranged. Each the pixel unit includes one thin film transistor 21 and one organic light-emitting layer 25. In the signal pin area C, multiple signal pins 262 are arranged at the inner side of the cover plate 10, each of which corresponds to one driving line RW1 or one sensing line RW2. One end of each signal pin 262 is electrically connected to a corresponding driving line RW1 or a corresponding sensing lines through the conductive structure 11, respectively. The opposite end of the signal pin 262 connects to a corresponding touch signal transmission line 213. The touch signal transmission line 213 may be electrically connected to a touch driving chip. Thus, a touch signal is transmitted to the driving line RW1 and the sensing line RW2 through the touch signal transmission line 213, the signal pin 262, and the conductive structure 11. In this way, the OLED display apparatus with the in cell touch structure is improved and the touch signal transmission structure is arranged inside the OLED display apparatus.

In an embodiment, in the display area A, the array substrate 20 includes from bottom to top in this order: a thin film transistor 21, an organic planarizing layer 22, an anode 23, a pixel defining layer 24, an organic light-emitting layer 25, and a cathode 261. In the signal pin area C, the array substrate 20 includes orderly from down to up: a touch signal transmission line 213, an organic planarizing layer 22, an anode conductive layer 231, a pixel defining layer 24, and a signal pin 262. The touch signal transmission line 213 is disposed at the same layer as the source 211 and the drain 212 of the thin film transistor 21, the anode conductive layer 231 is disposed at the same layer as the anode 23, and the signal pin 262 is disposed at the same layer as the cathode 261.

In the first embodiment, the signal pin is disposed at the conductive layer which is disposed above the protective layer. The second embodiment differs from the first embodiment in that the signal pin 262 is disposed at the same layer as the cathode 261, i.e., the signal pin 262 is formed in the same process step with the cathode 261. In the OLED display apparatus with the in cell touch structure according to the second embodiment, a process for forming the touch signal transmission line 213 and the signal pin 262 on a surface of the signal pin area of the array substrate 20 is compatible with a process for forming the display area A. That is, a structure in the signal pin area C and a structure in the display area A are formed in the same process step. Thus, the OLED display apparatus with the in cell touch structure is implemented, the touch signal transmission structure is arranged inside the OLED display apparatus, and thus no new step is added in the process for manufacturing the array substrate 20 and production cost may not be increased.

In the signal pin area C, a via hole 222 is formed in the organic planarizing layer 22 disposed on the touch signal transmission line 213, to expose a portion of the touch signal transmission line 213. The anode conductive layer 231 formed on the organic planarizing layer 22 is electrically connected to the touch signal transmission line 213 through the via hole 222. A via hole 241 is formed in the pixel defining layer 24 disposed on the anode conductive layer 231, to expose a portion of the anode conductive layer 231. The signal pin 262 formed on the pixel defining layer 24 is electrically connected to the anode conductive layer 231 through the via hole 241. Thus, the signal pin 262 is electrically connected to the touch signal transmission line 213 through the anode conductive layer 23. In the other implementation way, the signal pin may be electrically connected to the touch signal transmission line directly through a via hole in the organic planarizing layer and the pixel defining layer, instead of through the anode conductive layer. However, the via hole, penetrating the organic planarizing layer and the pixel defining layer, has a large depth. When a film is formed for the signal pin in the via hole, the stability of the film may be reduced. Therefore, preferably, in the second embodiment, the signal pin 262 is electrically connected to the touch signal transmission line 213 through the anode conductive layer 231, to ensure that a device has a good reliability.

Preferably, in the display area A disposed at the inner side of the array substrate 20, a protective layer is also formed on the cathode 261 to isolate and protect devices in the display area A. In an evaporation process for forming the protective layer, only the signal pin 262 in the signal pin area C need to be shield by a mask, to ensure an electrical connection between the signal pin 262 and the conductive structure 11 when the cover plate 10 is bonded to the array substrate 20.

Figure 7:
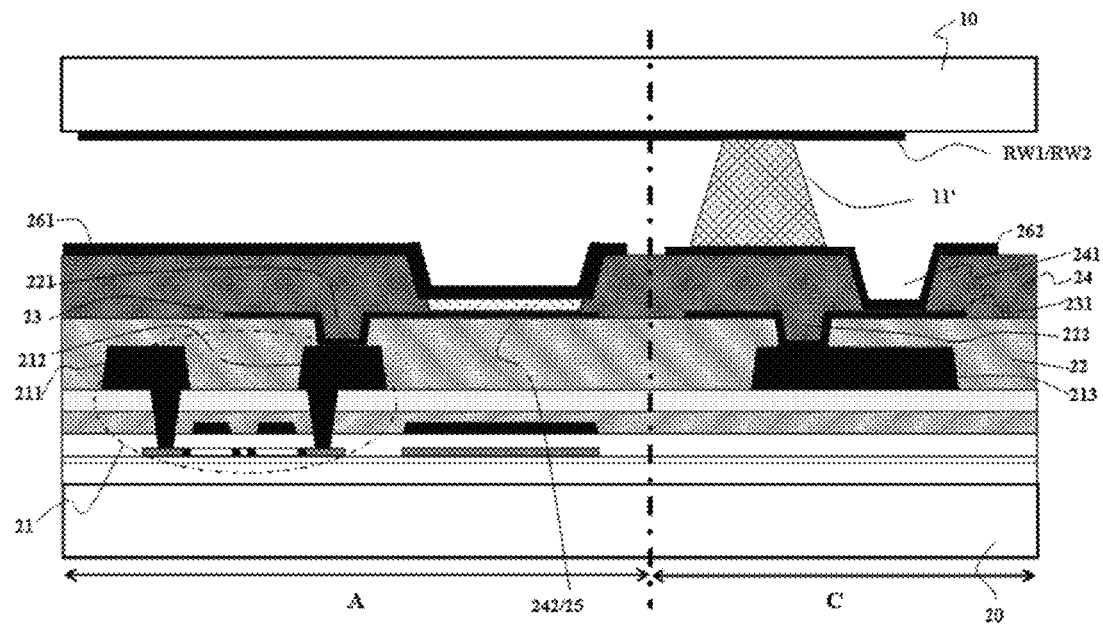
FIG. 7 is a cross-sectional view of another implementation according to the second embodiment.

In another implementation, the conductive structure may also be formed at the inner side of the array substrate. FIG. 7 is another implementation way according to the second embodiment. Referring to FIG. 7, a conductive structure 11' is formed on a side of the array substrate 20 and is electrically connected to the signal pin 262. When the cover plate 10 is bonded to the array substrate 20, the conductive structure 11' will be electrically connected to a corresponding driving line or a corresponding sensing line, thus achieving the same technical effect as the second embodiment. The other implementation way according to the second embodiment differs from the second embodiment in that a process for forming the conductive structure 11' on a side of the array substrate is added.

Figure 8:
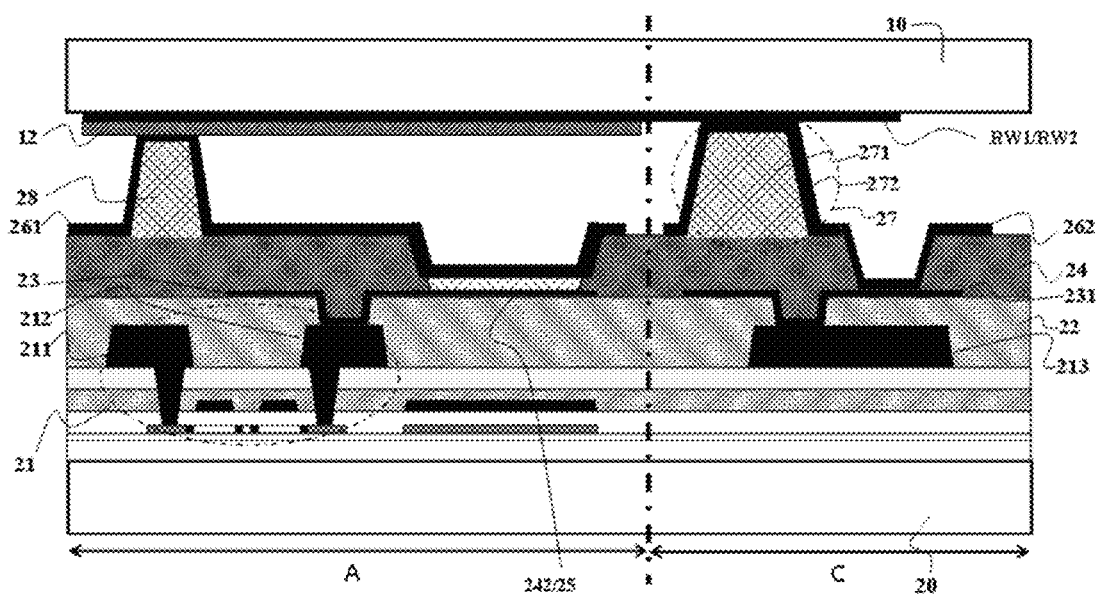
FIG. 8 is a cross-sectional view of an OLED display apparatus with an in cell touch structure according to a third embodiment of the disclosure.

FIG. 8 is a cross-sectional view of an OLED display apparatus with an in cell touch structure according to a third embodiment of the disclosure. As shown in FIG. 8, the OLED display apparatus with the in cell touch structure includes a cover plate 10 and an array substrate 20 facing the cover plate 10. The OLED display apparatus with the in cell touch structure is divided into a display area A, a layout area B (not shown), and a signal pin area C.

Multiple driving lines RW1 and multiple sensing lines RW2 are arranged at an inner side of the cover plate 10 facing the array substrate. The driving lines RW1 cross the sensing lines RW2 and are insulated from the sensing lines RW2. The driving lines RW1 and the sensing lines RW2 extend from the display area A up to the signal pin area C.

At the inner side of the array substrate 20, in the display area A, multiple pixel units are arranged. Each pixel unit includes a thin film transistor 21 and a organic light-emitting layer 25. In the signal pin area C, multiple signal pins 262 are arranged at the inner side of the cover plate 10, each of which corresponds to one of the driving lines RW1 or one of the sensing lines RW2. One end of each signal pin 262 is electrically connected to the corresponding driving line RW1 or the corresponding sensing line RW2 through the conductive structure 27. The opposite end of the signal pin 262 is connected to a corresponding touch signal transmission line 213. The touch signal transmission line 213 may be electrically connected to a touch driving chip. Therefore, a touch signal is transmitted to the driving line RW1 and the sensing line RW2 through the touch signal transmission line 213, the signal pin 262, and the conductive structure 27, and thus the OLED display apparatus with the in cell touch structure is implemented and the touch signal transmission structure is arranged inside the OLED display apparatus.

In an embodiment, the conductive structure 27 includes a non-conductive support member 271 and a conductive layer 272, and the conductive structure 27 is formed at the inner side of the array substrate 20.

In the third embodiment, at the inner side of the array substrate 20, in the display area A, structures of the thin film transistor 21 to the pixel defining layer 24 are the same as those in the first embodiment and the second embodiment, which will not be described in detail herein for the sake of brevity. The third embodiment differs from the first embodiment and the second embodiment is that: at the inner side of the array substrate 20, an in-plane support member 28 is further formed in the display area A to support the cover plate 10. The in-plane support member 28 is formed between the pixel defining layer 24 and the cathode 261. In a specific embodiment, the pixel defining layer 24 is first formed, the in-plane support member 28 is then formed on the pixel defining layer 24, an upper organic light-emitting layer 25 is formed after the in-plane support member 28 is formed, and then the cathode 261 is formed to cover the organic light-emitting layer 25 and the in-plane support member 28. Since the OLED display apparatus is disposed on a side of the array substrate 20, steps between film layers are large in the display area A of the arrange substrate. In order to position the in-plane support member 28 at the highest region of the substrate, the in-plane support member 28 is formed by a photolithography process, and the position thereof is fixed. Then the organic light-emitting layer 25 and the cathode 261 are formed in an evaporation process after the in-plane support member 28 is formed.

In the signal pin area C of the array substrate 20, structures of the touch signal transmission line 213 to the pixel defining layer 24 may be the same as those in the first embodiment and the second embodiment, which will not be described in detail herein. The third embodiment differs from the first embodiment and the second embodiment is that: at the inner side of the array substrate 20, a non-conductive support member 271 is formed in the signal pin area C and in the same process step as the in-plane support 28. A conductive layer 272 is formed on the non-conductive support member 271 to cover the non-conductive support member 271. The conductive layer 272 is electrically connected to the signal pin 262. Preferably, in the third embodiment, the conductive layer 272, the signal pin 262 are disposed in the same layer as the cathode 261 of the display area A and are formed in the same process for forming the cathode 261.

In the OLED display apparatus with the in cell touch structure according to the third embodiment, the conductive structure 27 is arranged on a surface of the array substrate 20. The non-conductive support 271 is formed in the same process with the in-plane support member 28, and its conductive layer 272 is formed in the same process for forming the cathode 261. Thus, the driving lines, the sensing lines and the touch signal transmission structure are arranged inside the OLED display device, so that no new steps are required in the process for manufacturing the array substrate and production costs remain the same.

In the third embodiment, in the display area A of the cover plate 10, a touch protective layer 12 is also arranged on multiple driving lines RW1 and multiple sensing lines RW2. The touch protective layer 12 is adapted to protect the driving lines RW1 and the sensing lines RW2, and prevent the driving lines RW1 or the sensing lines RW2 from being damaged by the in-plane support 28.

Figure 9:
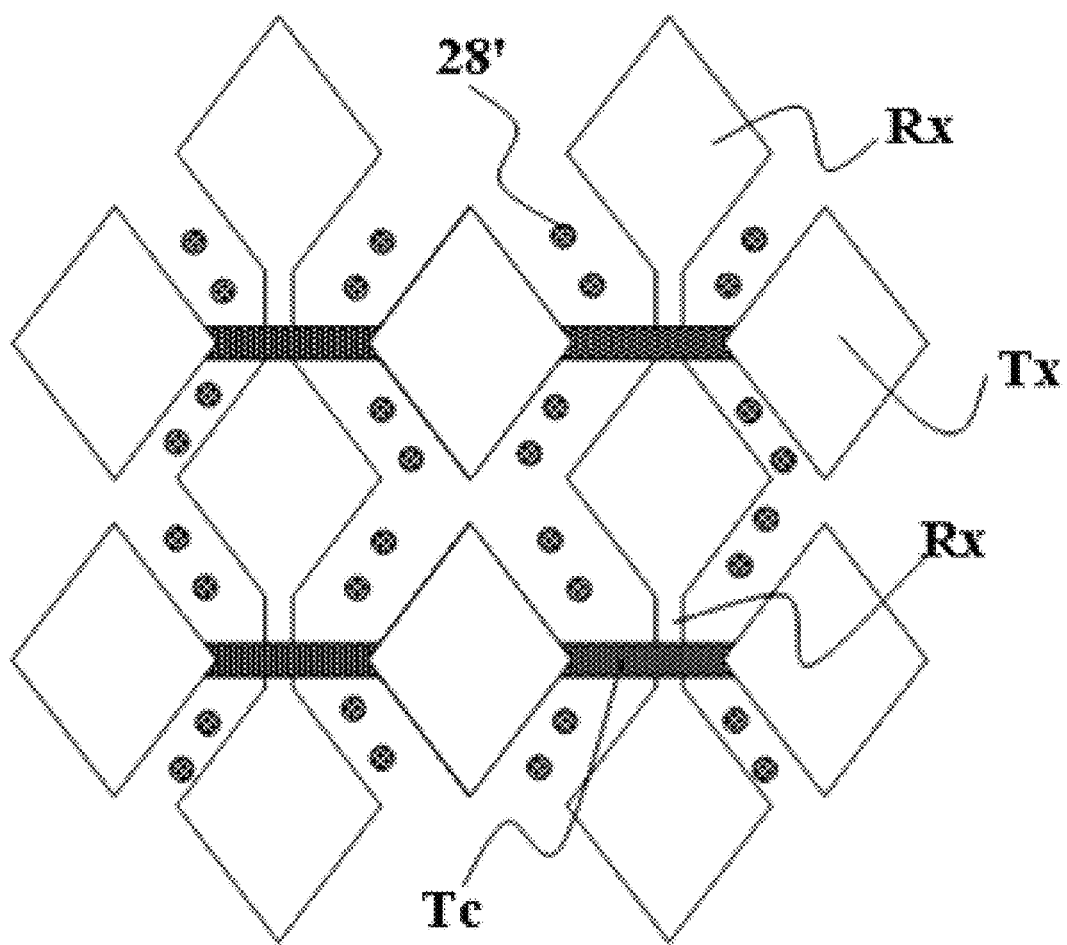
FIG. 9 is a top view of another implementation according to the third embodiment.

In an alternative implementation, the touch protective layer may not be arranged. Specifically, FIG. 9 is a top view of another implementation of the third embodiment. Referring to FIG. 9, each of the driving lines disposed at the inner side of the cover plate includes multiple driving electrodes Tx. The adjacent driving electrodes are connected through a first connecting line Tc. Each of the sensing lines includes multiple sensing electrodes Rx. The adjacent sensing electrodes Rx are connected through a second connecting line Rc. Multiple in-plane supports 28' are arranged at the inner side of the array substrate. The in-plane support member 28' does not overlap with the driving electrode Tx, the sensing electrode Rx, the first connecting line Tc, and the second connecting line Rc. That is, according to this design, the in-plane supports 28' are interlaced with the driving electrodes Tx, the sensing electrodes Rx, the first connecting lines Tc, and the second connecting lines Rc after the cover plate is bonded to the array substrate. In this way, the in-plane support members 28' may not damage the driving lines or the sensing lines in the case that the touch protective layer is omitted. Thus, the touch protective layer can be omitted to reduce process steps and manufacturing costs without affecting the reliability of the touch structure.

Figure 10:
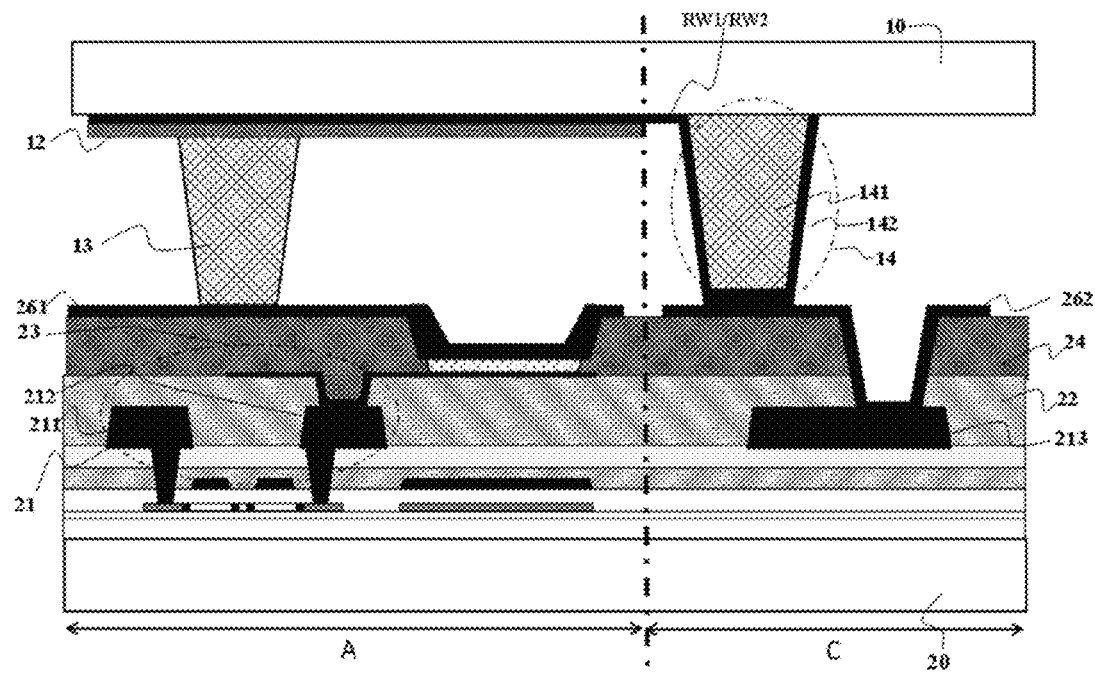
FIG. 10 is a cross-sectional view of yet another implementation according to the third embodiment.

In the other implementation way, the conductive structure may also be formed on a side of the cover plate. FIG. 10 is a cross-sectional view of yet another implementation of the third embodiment. Referring to FIG. 10, the conductive structure 14 includes a non-conductive support member 141 and a conductive layer 142 overlying the non-conductive support member 141. The conductive structure 14 is formed at the inner side of the cover plate 10. The non-conductive support member 141 of the conductive structure 14 is formed in the same process for forming the in-plane support member 13, and formed below the driving line RW1 and the sensing line RW2. Preferably, a touch protective layer 12 is arranged between the in-plane support member 13 and the driving lines RW1 and sensing lines RW2. The conductive layer 142 of the conductive structure 14 is electrically connected to the driving lines and sensing lines. After the cover plate 10 is bonded to the array substrate 20, the conductive layer 142 is electrically connected to the signal pins 262, thus achieving the same effect as the third embodiment. However in the yet another implementation of the third embodiment, it is required to align the cover plate 10 with the array substrate 20 accurately, to ensure that the in-plane support member 13 does not overlap with the organic light-emitting layer 25 a for not negatively affecting the display.

In other implementations, the in-plane support member may also be arranged on a surface of the array substrate and the conductive structure may also be arranged on a surface of the cover plate, as long as it can be ensured that electrical connections between the driving line and sensing line and the signal pin can all achieve the same technical effect.

While the invention has been described with respect to specific embodiments, one skilled in the art will recognize that numerous modifications are possible. Thus, it will be appreciate that the invention is intended to cover all modifications and equivalents within the scope of the following claims.

What is claimed is:

1. An OLED display apparatus with an in cell touch structure, the OLED display apparatus comprising:
   a cover plate; an array substrate facing the cover plate;
   an organic light-emitting layer arranged between the cover plate and the array substrate;
   a plurality of driving lines and a plurality of sensing lines arranged at an inner side of the cover plate facing the array substrate;
   a plurality of touch signal transmission lines arranged at the inner side of the array substrate facing the cover plate;
   a plurality of signal pins disposed on the touch signal transmission lines at the inner side of the array substrate facing the cover plate wherein each of the signal pins corresponds to one of the driving lines or one of the sensing lines, and the plurality of signal pins are electrically connected to the plurality of touch signal transmission lines respectively; and
   a plurality of conductive structures connecting, with one end, the driving lines or the sensing lines and connecting, with the opposite end, to the associated signal pins and the touch signal transmission lines.

2. The OLED display apparatus according to claim 1, wherein the conductive structure provides mechanical support to the cover plate.

3. The OLED display apparatus according to claim 2, wherein the conductive structure is formed on a surface of the cover plate, or on a surface of the array substrate.

4. The OLED display apparatus according to claim 1, wherein the conductive structure comprises a non-conductive support member and a conductive layer, and the conductive layer is adapted to electrically connect one of the signal pins to one of the corresponding driving lines or one of the corresponding sensing lines.

5. The OLED display apparatus according to claim 4, wherein the conductive structure is arranged at the inner side of the array substrate.

6. The OLED display apparatus according to claim 5, wherein the non-conductive support member of the conductive structure is arranged below a cathode layer, and the conductive layer of the conductive structure is disposed at a same layer as the cathode layer.

7. The OLED display apparatus according to claim 6, wherein the non-conductive support member of the conductive structure is formed in a same process for forming an in-plane support member.

8. The OLED display apparatus according to claim 7, wherein a touch protective layer is formed on the plurality of driving lines and the plurality of sensing lines facing the array substrate.

9. The OLED display apparatus according to claim 7, wherein the in-plane support member does not overlap with the driving lines and the sensing lines.

10. The OLED display apparatus according to claim 4, wherein the conductive structure is arranged at the inner side of the cover plate.

11. The OLED display apparatus according to claim 1, wherein the cover plate is bonded to the array substrate to form a sealed space, and the signal pins and the conductive structure are arranged inside the sealed space.

12. The OLED display apparatus according to claim 1, wherein the signal pins are arranged on a cathode protective layer.

13. The OLED display apparatus according to claim 1, wherein the signal pins are arranged at the same layer as a cathode.

14. The OLED display apparatus according to claim 1, wherein the touch signal transmission line is disposed at a same layer as a source and a drain of a thin film transistor, and wherein the touch signal transmission line is disposed in a same layer as a gate of a thin film transistor.

15. The OLED display apparatus according to claim 1, wherein the touch signal transmission line is disposed at a same layer as a source and a drain of a thin film transistor, and wherein the touch signal transmission line is disposed in a same layer as an anode.

* * * * *